(12) United States Patent
Qu

(10) Patent No.: US 12,453,233 B2
(45) Date of Patent: Oct. 21, 2025

(54) DISPLAY DEVICE HAVING A FUNCTIONAL LAYER FOR IMPROVING DISPLAY PERFORMANCE

(71) Applicant: SHARP KABUSHIKI KAISHA, Sakai (JP)

(72) Inventor: Yang Qu, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 638 days.

(21) Appl. No.: 17/794,603

(22) PCT Filed: Feb. 6, 2020

(86) PCT No.: PCT/JP2020/004514
§ 371 (c)(1),
(2) Date: Jul. 21, 2022

(87) PCT Pub. No.: WO2021/156999
PCT Pub. Date: Aug. 12, 2021

(65) Prior Publication Data
US 2023/0071128 A1    Mar. 9, 2023

(51) Int. Cl.
*H10K 50/115* (2023.01)
*H10K 50/15* (2023.01)
(Continued)

(52) U.S. Cl.
CPC ........... *H10K 50/115* (2023.02); *H10K 50/15* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2007/0215865 A1   9/2007   Liu et al.
2007/0215879 A1   9/2007   Liu et al.
(Continued)

FOREIGN PATENT DOCUMENTS

JP   2009530847 A   8/2009
JP   2010087276 A   4/2010
(Continued)

*Primary Examiner* — Sue A Purvis
*Assistant Examiner* — Seyon Ali-Simah Punchbeddell
(74) *Attorney, Agent, or Firm* — ScienBiziP, P.C.

(57) ABSTRACT

A display device has a thin-film transistor layer, a light-emitting layer including a plurality of light-emitting elements each of which includes a first electrode, a functional layer, and a second electrode, and that emit mutually different colors of light. The functional layer contains a functional material that contributes to the function of the functional layer, and an additive added to the functional layer in a predetermined range of additive amount and having a smaller size than the functional material. The functional layer includes a quantum-dot light-emitting layer containing a quantum dot. The additive added to a quantum-dot light-emitting layer has a size that decreases in an order of a red quantum-dot light-emitting layer, a green quantum-dot light-emitting layer and a blue quantum-dot light-emitting layer, in accordance with a size of a corresponding quantum dot.

17 Claims, 17 Drawing Sheets

(51) Int. Cl.
   *H10K 50/16*      (2023.01)
   *H10K 50/17*      (2023.01)
   *H10K 59/122*     (2023.01)
   *H10K 59/80*      (2023.01)

(52) U.S. Cl.
   CPC ....... *H10K 59/122* (2023.02); *H10K 59/8051* (2023.02)

(56) References Cited

U.S. PATENT DOCUMENTS

| | | | |
|---|---|---|---|
| 2010/0258789 A1* | 10/2010 | Akai | C09K 11/883 |
| | | | 257/E51.026 |
| 2012/0074360 A1 | 3/2012 | Funyuu et al. | |
| 2015/0263288 A1 | 9/2015 | Funyuu et al. | |
| 2016/0097889 A1* | 4/2016 | Kim | G02B 6/005 |
| | | | 362/606 |
| 2018/0145257 A1 | 5/2018 | Funyuu et al. | |
| 2019/0363279 A1 | 11/2019 | Yamaguchi et al. | |
| 2020/0006661 A1 | 1/2020 | Shinokawa et al. | |
| 2020/0106036 A1* | 4/2020 | Cheng | H10K 71/00 |
| 2020/0313108 A1* | 10/2020 | Jang | H10K 30/865 |
| 2021/0028366 A1 | 1/2021 | Funyuu et al. | |

FOREIGN PATENT DOCUMENTS

| | | | |
|---|---|---|---|
| JP | 2012234748 A | 11/2012 | |
| JP | 2019204664 A | 11/2019 | |
| JP | 2020004674 A | 1/2020 | |
| KR | 101562558 B1 | 10/2015 | |
| WO | 2010/140553 A1 | 12/2010 | |

* cited by examiner

FIG. 5
(a)
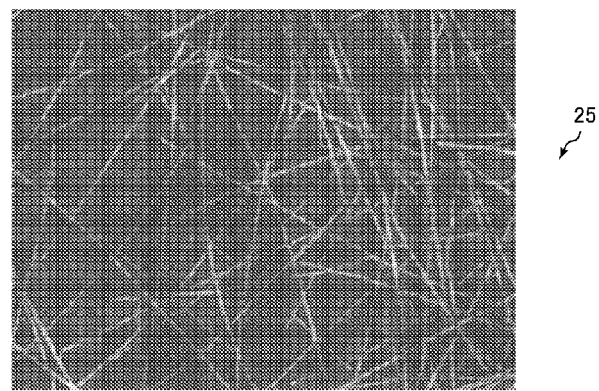
(b)
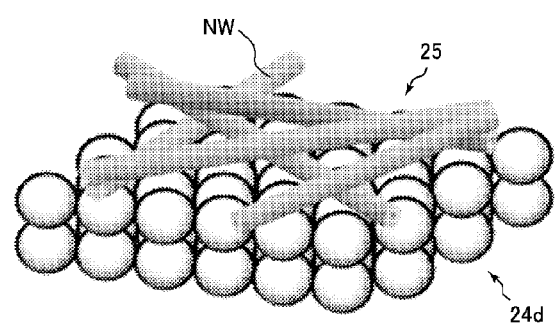
(c)
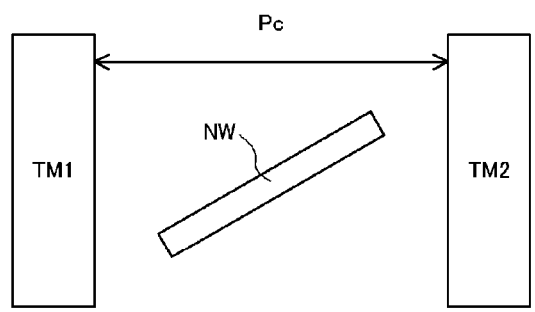

FIG. 10
(a)
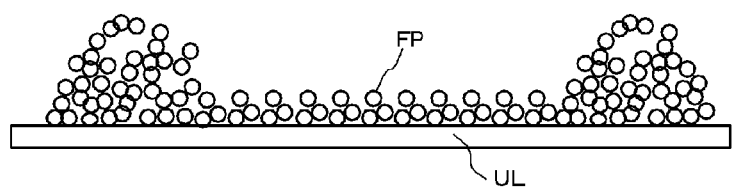
(b)
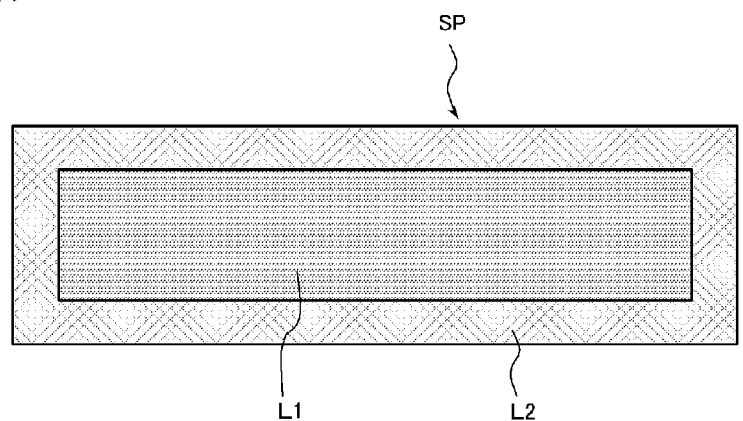

FIG. 11
(a)
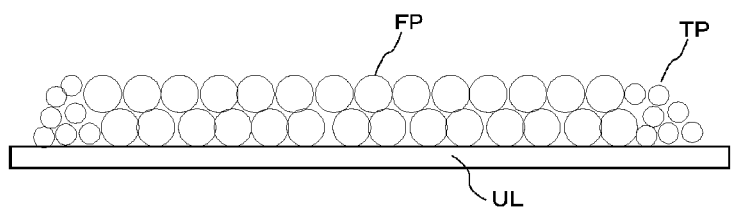
(b)
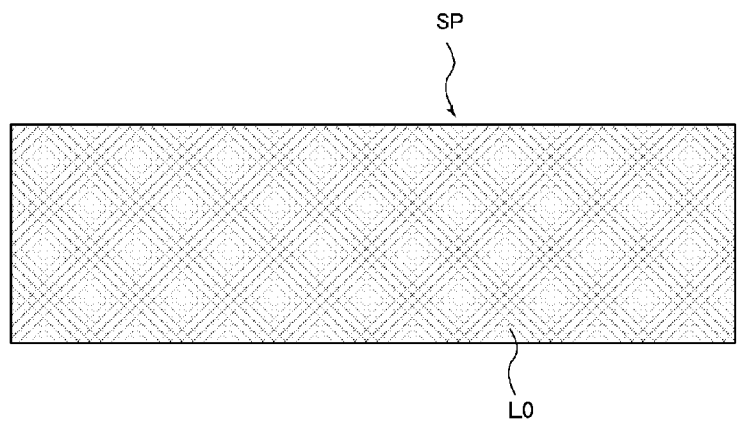

FIG. 13
(a)
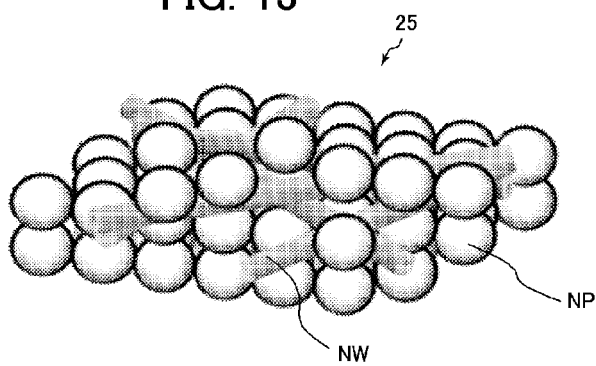
(b)
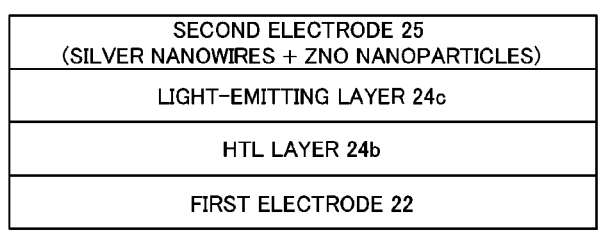
(c)
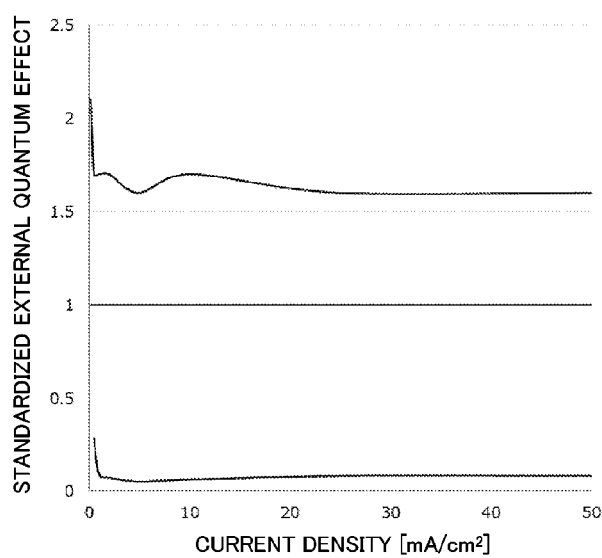

DISPLAY DEVICE HAVING A FUNCTIONAL LAYER FOR IMPROVING DISPLAY PERFORMANCE

TECHNICAL FIELD

The disclosure relates to a display device and a method for manufacturing the display device.

SUMMARY

Background Art

The development and commercialization of self-emission display devices has been recently pursued instead of non-self-emission liquid crystal displays. In such display devices that require no backlight, light-emitting elements, including organic light-emitting diodes (OLEDs) and quantum-dot light-emitting diodes (QLEDs), are provided for each pixel.

Moreover, such a self-emission display device as described above includes a first electrode, a second electrode, and a functional layer located between the first electrode and the second electrode and including at least a light-emitting layer. Furthermore, in such a display device, attempts have been made to, for instance, form each layer of the functional layer with a liquid-drop method, such as spin coating or ink-jet application rather than with an already existing evaporation method in order to manufacture high-definition display devices inexpensively and easily.

Moreover, in such a liquid-drop method as described above, forming, for each pixel, at least one layer included in the functional layer has been proposed by typically providing a bank partitioning the pixels.

CITATION LIST

Patent Literature

Patent Literature 1: Japanese Unexamined Patent Application Publication No. 2012-234748

SUMMARY OF INVENTION

Technical Problem

By the way, in such a known display device as described above and a method for manufacturing the display device, a light-emitting layer is formed in a region surrounded by the foregoing bank, which has a frame shape, by dropping or coating a solution containing the constituent material (functional material) of a functional layer, for instance, a light-emitting layer and containing a predetermined solvent, followed by drying the solution (vaporizing the solvent).

However, this known display device and method for manufacturing the display device possibly fails to render the thickness of a functional layer, for instance, a light-emitting layer, uniform due to a coffee ring effect occurring inside the bank during solution drying. To be specific, in the known display device and method for manufacturing the display device, segregation of film ingredients is sometimes found, for instance, in the periphery of the light-emitting layer further than in the middle of the light-emitting layer due to a coffee ring effect inside the bank. Hence, in the known display device and method for manufacturing the display device, the middle of the light-emitting layer is extremely thin and sometimes fail to contribute as a light-emission region, thereby unfortunately degrading display performance.

In view of the above problem, the disclosure aims to provide a display device that can prevent degradation in display performance even when a functional layer is formed using a drop method, and to provide a method for manufacturing the display device.

To achieve the above object, a display device according to the disclosure is a display device provided with a display region having a plurality of pixels, and a frame region surrounding the display region, the display device including:

a thin-film transistor layer; and a light-emitting layer of the electroluminescence device including a plurality of light-emitting diodes (elements) each including a first electrode, a functional layer, and a second electrode, the plurality of light-emitting diodes (elements) being configured to emit mutually different colors of light, wherein the functional layer contains a functional material that contributes to the function of the functional layer, and an additive added to the functional layer in a predetermined range of additive amount and having a smaller size than the functional material.

In the display device configured as described above, the functional layer contains a functional material, and an additive added to the functional layer in a predetermined range of additive amount and having a smaller size than the functional material. This can avoid the functional material from segregation caused in the periphery of the functional layer by a coffee ring effect further than in the middle of the functional layer even when the functional layer is formed using a drop method. As a result, degradation in the display performance of the display device can be avoided.

Moreover, a method for manufacturing a display device according to the disclosure is a method for manufacturing a display device provided with a display region having a plurality of pixels, and a frame region surrounding the display region, the display device being provided with a thin-film transistor layer, and a light-emitting layer including a plurality of light-emitting diodes (elements) each including a first electrode, a functional layer and a second electrode, the plurality of light-emitting diodes (elements) being configured to emit mutually different colors of light, the method comprising:

a solution formation step of putting a functional material that contributes to the function of the functional layer into a predetermined solvent, and adding an additive having a smaller size than the functional material into the predetermined solvent in a predetermined range of additive amount, to form a solution for forming the functional layer;

a solution-drop step of dropping the solution over the first electrode; and a function-layer formation step of drying the solvent within the solution dropped, to form a functional layer.

ADVANTAGEOUS EFFECT OF DISCLOSURE

In the method for manufacturing the display device configured as described above, the solution formation step includes putting a functional material that contributes to the function of the functional layer into a predetermined solvent, and adding an additive having a smaller size than the functional material in a predetermined range of additive amount, to form a solution for forming the functional layer. This can avoid the functional material from segregation caused in the periphery of the functional layer by a coffee ring effect further than in the middle of the functional layer after the solvent within the solution dropped is dried to form the functional layer. As a result, degradation in the display performance of the display device can be avoided.

Advantageous Effect of Invention

Degradation in display performance can be prevented even in forming a functional layer using a drop method.

BRIEF DESCRIPTION OF DRAWINGS

FIG. 5(a) is a photograph showing a specific configuration of a second electrode shown in FIG. 2. FIG. 5(b) is a perspective view of a specific configuration of the second electrode. FIG. 5(c) is a schematic diagram relating to the length of a metal nanowire contained in the second electrode.

FIG. 10 illustrates a problem in a comparative example; FIG. 10(a) illustrates how a functional layer is formed in the comparative example, and FIG. 10(b) illustrates how a subpixel emits light in the comparative example.

FIG. 11 illustrates an effect in the device according to this embodiment; FIG. 11(a) illustrates how the functional layer is formed in the device according to this embodiment, and FIG. 11(b) illustrates how a subpixel emits light in the device according to this embodiment.

FIG. 13 illustrates main components in a second modification of the display device; FIG. 13(a) is a perspective view of a specific configuration of the second electrode in the second modification, FIG. 13(b) illustrates a specific configuration of the light-emitting layer in the second modification, and FIG. 13(c) is a graph showing an effect in the second modification.

The embodiments of the disclosure will be detailed based on the drawings. It is noted that the disclosure is not limited to the following embodiments. Moreover, the term "in the same layer" hereinafter refers to that one layer is formed in the same process step (film formation step) as another layer. The term "under" hereinafter refers to that one layer is formed in a process step anterior to a process step of forming a comparative layer. The term "over" hereinafter refers to that one layer is formed in a process step posterior to a process step of forming a comparative layer. Moreover, the sizes of components within each drawing do not truly reflect their actual sizes, the ratio of size of the components, and other things.

FIRST EMBODIMENT

Figure 1:
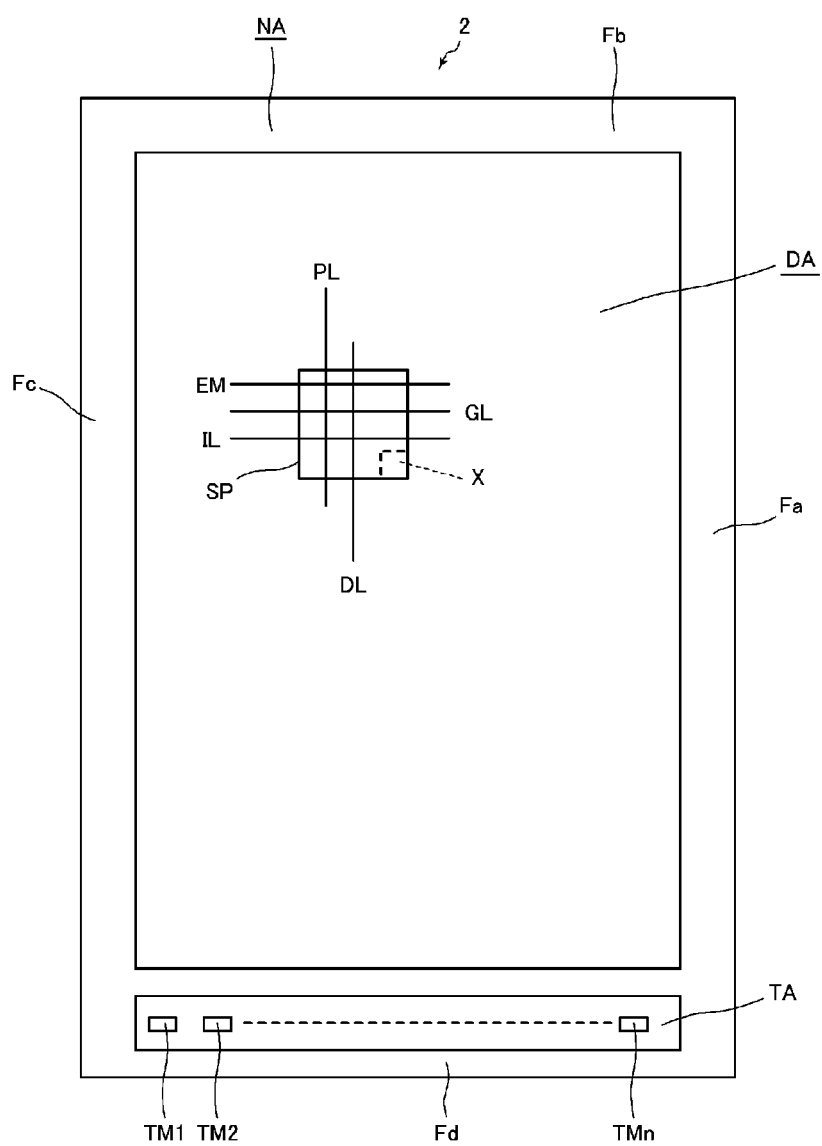
FIG. 1 is a schematic diagram of a configuration of a display device according to a first embodiment of the disclosure.
Figure 2:
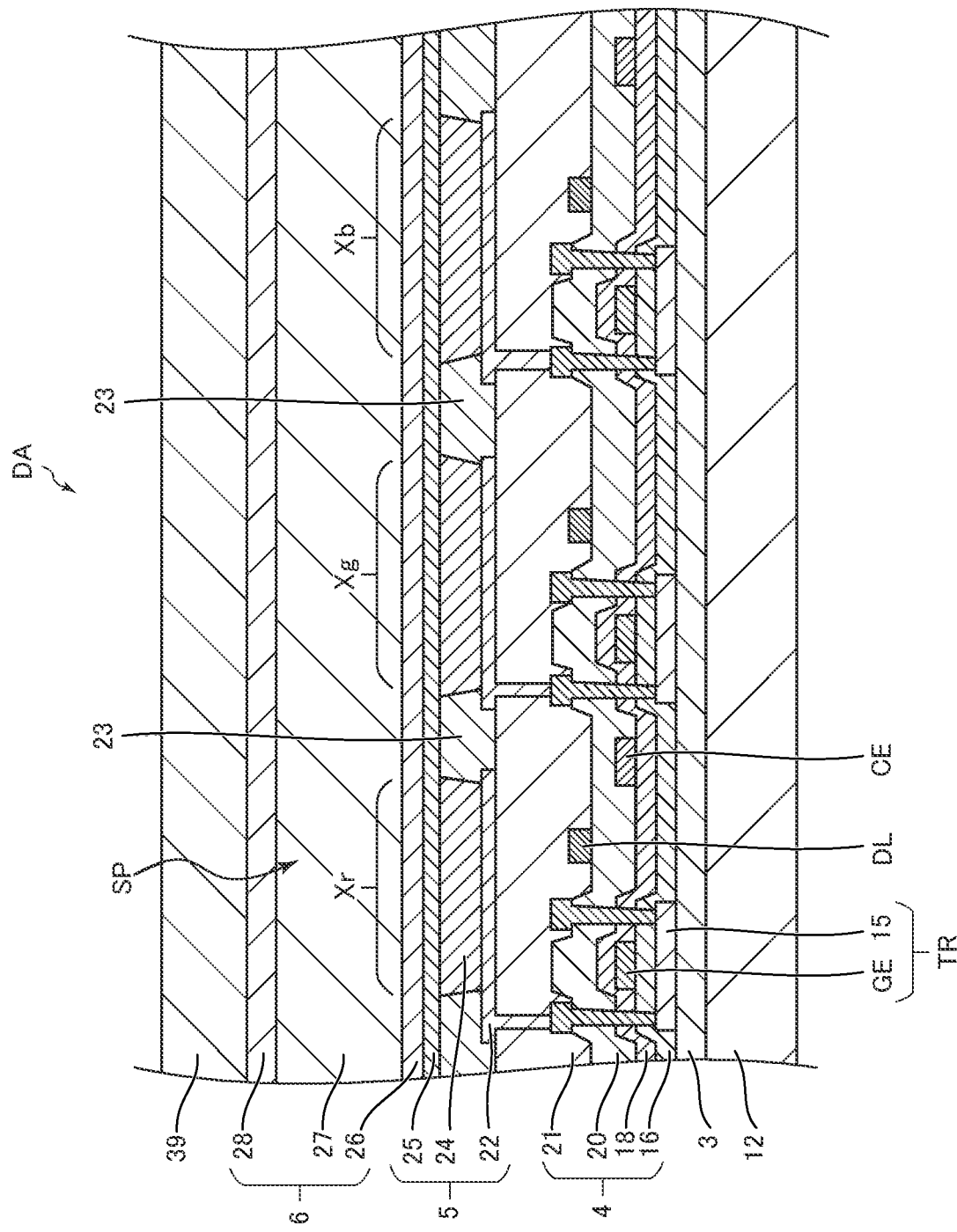
FIG. 2 is a sectional view of main components of the display device shown in FIG. 1.
Figure 3:
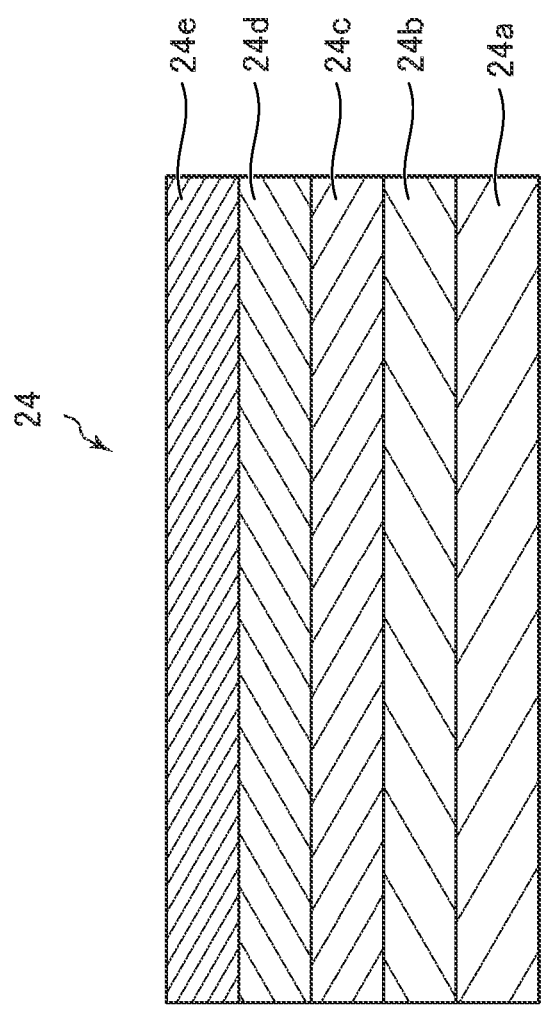
FIG. 3 is a sectional view of a specific configuration of a functional layer shown in FIG. 2.
Figure 4:
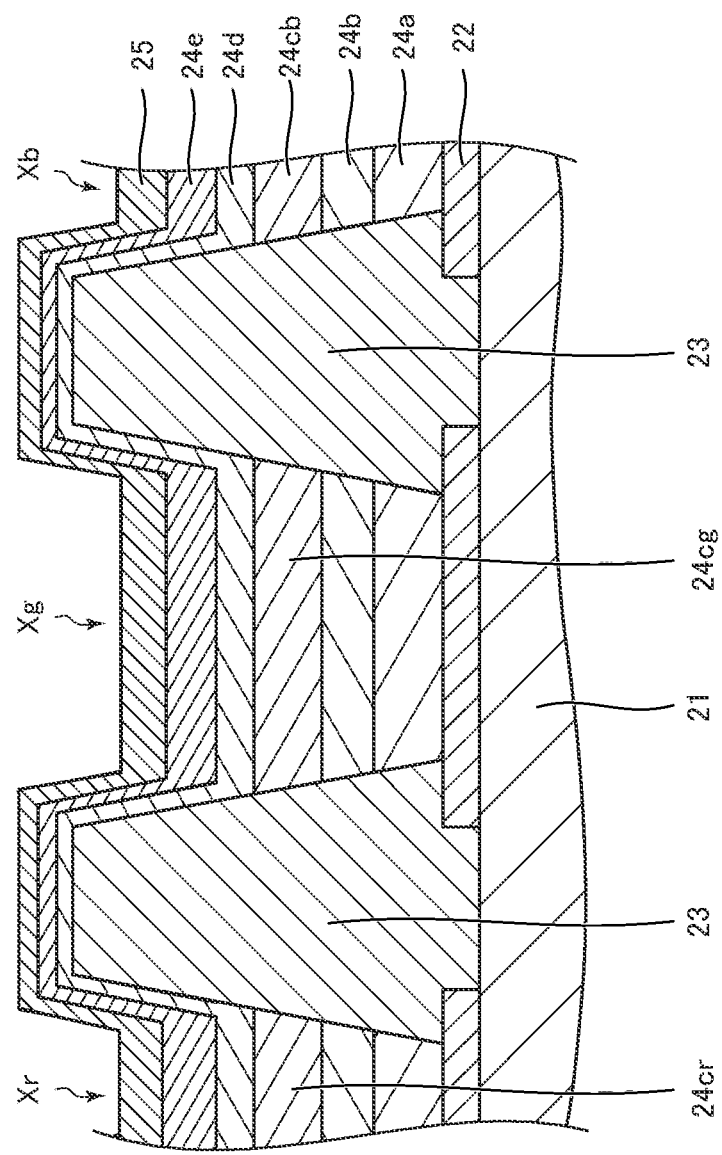
FIG. 4 is a sectional view of a specific example configuration of a light-emitting element shown in FIG. 2.
Figure 6:
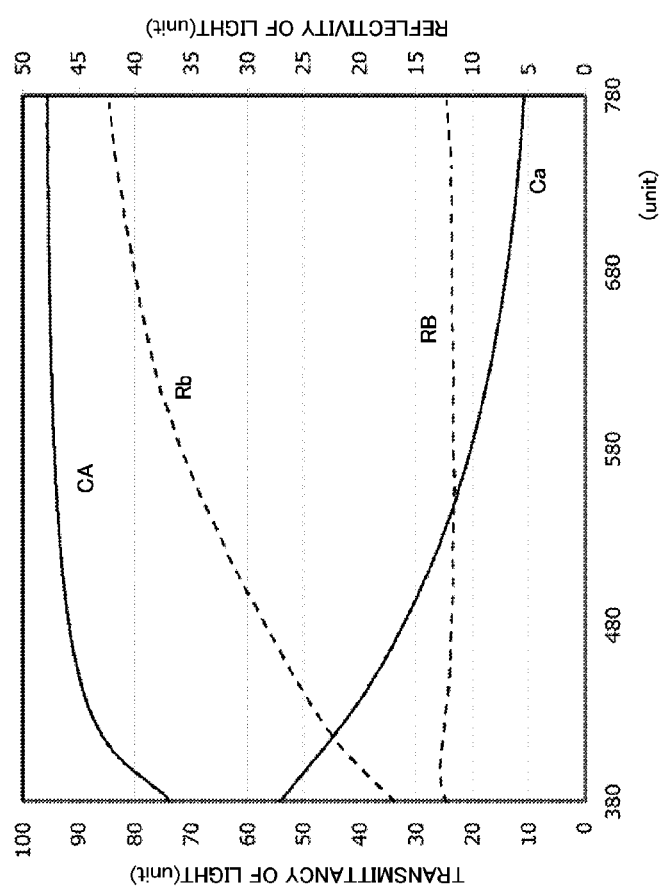
FIG. 6 is a graph showing an effect of the second electrode shown in FIG. 2.

FIG. 1 is a schematic diagram of a configuration of a display device according to a first embodiment of the disclosure. FIG. 2 is a sectional view of main components of the display device shown in FIG. 1. FIG. 3 is a sectional view of a specific configuration of a functional layer shown in FIG. 2. FIG. 4 is a sectional view of a specific example configuration of a light-emitting element shown in FIG. 2. FIG. 5(a) is a photograph illustrating a specific configuration of a second electrode shown in FIG. 2. FIG. 5(b) is a perspective view of a specific configuration of the second electrode. FIG. 5(c) is a schematic diagram relating to the length of a metal nanowire contained in the second electrode. FIG. 6 is a graph showing an effect of the second electrode shown in FIG. 2.

As illustrated in FIGS. 1 and 2, a display device 2 according to this embodiment has a base 12 on which a barrier layer 3, a thin-film transistor (TFT) layer 4, a top-emission light-emitting layer 5, and a sealing layer 6 are provided in this order, and the display device 2 has a display region DA in which a plurality of subpixels SP are formed A frame region NA surrounding the display region DA consists of four side edges Fa to Fd, among which the side edge Fd is provided with a terminal section TA formed for mounting electronic circuit boards (e.g., an IC chip and an FPC). A plurality of terminals TM1, TM2, and TMn (n is an integer equal to or greater than two) are included in the terminal section TA. The plurality of terminals TM1, TM2, and TMn are provided along one of the four sides of the display region DA, as illustrated in FIG. 1. It is noted that a driver circuit (not shown) can be formed at each of the side edges Fa to Fd.

The base 12 may be a glass substrate, or a flexible substrate including a film of resin, such as polyimide. Moreover, the base 12 can constitute a flexible substrate using two resin films and an inorganic insulating film interposed between the resin films. Furthermore, a film, such as a PET film, may be attached on the lower surface of the base 12. Moreover, the display device 2 having flexibility, that is, a flexible display device 2 can be formed when a flexible substrate is used for the base 12.

The barrier layer 3 protects the thin-film transistor layer 4 and the light-emitting layer 5 from intrusion of foreign substances, including water and oxygen, and can be composed of, for instance, a silicon oxide film, a silicon nitride film, or a silicon oxide nitride film, all of which are formed through CVD, or a laminated film of these materials.

As illustrated in FIG. 2, the thin-film transistor layer 4 includes a semiconductor layer (including a semiconductor film 15) over the barrier layer 3, an inorganic insulating film 16 (gate insulating film) over the semiconductor layer, a first metal layer (including a gate electrode GE) over the inorganic insulating film 16, an inorganic insulating film 18 over the first metal layer, a second metal layer (including a capacitive electrode CE) over the inorganic insulating film 18, an inorganic insulating film 20 over the second metal layer, a third metal layer (including a data signal line DL) over the inorganic insulating film 20, and a flattening film 21 over the third metal layer.

The semiconductor layer is composed of, for instance, amorphous silicon, low-temperature polysilicon (LTPS), or an oxide semiconductor, and the gate electrode GE and the semiconductor film 15 together constitute a thin-film transistor TR.

It is noted that this embodiment has described the thin-film transistor TR of a top-gate type by way of example, the thin-film transistor TR may be a bottom-gate thin-film transistor.

The display region DA includes a light-emitting element X and a circuit for controlling the light-emitting element X, both of which are provided for each subpixel SP, and the thin-film transistor layer 4 includes these control circuits and wires connected to them. Examples of the wires connected to the control circuits include, but not limited to, a scan signal line GL and a light-emission control line EM, both of which are formed in the first metal layer, an initialization power-source line IL, which is provided in the second metal layer, and the data signal line DL and a high-voltage power-source line PL, both of which are provided in the third metal layer. The control circuits include, but not limited to, a drive transistor that controls a current flowing through the light-emitting element X, a write transistor electrically connected to the scan signal line, and a light-emission control transistor electrically connected to the light-emission control line.

The first metal layer, the second metal layer, and the third metal layer are composed of a monolayer or multilayer film of metal including at least one of, for instance, aluminum, tungsten, molybdenum, tantalum, chromium, titanium, and copper.

The inorganic insulating films 16, 18, and 20 can be composed of, for instance, a silicon oxide (SiOx) film or a silicon nitride (SiNx) film, both of which are formed through CVD, or can be composed of, for instance, a laminate of these films. The flattening film 21 can be made of an organic material that can be applied, such as polyimide or acrylic resin.

The light-emitting layer 5 includes a first electrode (anode) 22 over the flattening film 21, an insulating edge cover film 23 covering the edge of the first electrode 22, a functional layer 24 over the edge cover film 23, and a second electrode (cathode) 25 over the functional layer 24. That is, the light-emitting layer 5 includes a plurality of light-emitting elements X each including the first electrode 22, a light-emitting layer (described later on) included in the functional layer 24, and the second electrode 25, and the plurality of light-emitting elements X emit mutually different colors of light. The edge cover film 23 is formed by, for instance, applying an organic material, such as polyimide or acrylic resin, followed by patterning through photolithography. Moreover, the edge cover film 23 overlaps the end of a surface of the first electrode 22, which is in the form of an island, to define a pixel (subpixel SP) and is a bank partitioning each of a plurality of pixels (subpixels SP) in correspondence with each of the plurality of light-emitting elements X. Moreover, the functional layer 24 is an electroluminescence (EL) layer containing electroluminescence elements.

The light-emitting layer 5 includes a light-emitting element Xr (red), a light-emitting element Xg (green), and a light-emitting element Xb (blue) included in the light-emitting element X and configured to emit mutually different colors of light. Moreover, each light-emitting element X includes the first electrode 22, the functional layer 24 (including a light-emitting layer), and the second electrode 25. The first electrode 22 is an electrode in the form of an island provided for each light-emitting element X (i.e., the subpixel SP). The second electrode 25 is a flat electrode common to all the light-emitting elements X. Further, the second electrode 25 is composed of metal nanowires and is formed by applying a solution containing the metal nanowires, as described later on. Furthermore, using a metal nanowire for the second electrode 25 enables the functional layer 24 (each layer thereof, which will be described later on) and the second electrode 25, except for the first electrode 22, to be formed in the light-emitting layer 5 of the display device 2 according to the this embodiment through a drop method using a predetermined solution, thus enabling the display device 2 that is simply manufactured to be easily configured.

The light-emitting elements Xr, Xg, and Xb may be organic light-emitting diodes (OLEDs) having their light-emitting layers (described later on) as organic light-emitting layers, or these elements may be quantum-dot light-emitting diodes (QLEDs) having their light-emitting layers as quantum-dot light-emitting layers.

The functional layer 24 is composed of a stack of, for instance, in sequence from the bottom, a hole injection layer 24a, a hole transport layer 24b, a light-emitting layer 24c, an electron transport layer 24d, and an electron injection layer 24e. Moreover, the functional layer 24 may include an electron blocking layer or a hole blocking layer. The light-emitting layer 24c is formed in the form of islands in the openings of the edge cover film 23 (for each subpixel SP) through a drop method, such as an ink-jet method. The other layers are formed in the form of islands or in a flat manner (common layers). The functional layer 24 can have a configuration where one or more of the hole injection layer 24a, the hole transport layer 24b, the electron transport layer 24d and the electron injection layer 24e are not formed.

The display device 2 according to this embodiment has a so-called known structure where, as illustrated in FIG. 2, an anode (first electrode 22), the functional layer 24, and a cathode (second electrode 25) are provided sequentially on the thin-film transistor layer 4.

Moreover, as illustrated in FIG. 4, in the display device 2 according to this embodiment, the light-emitting elements Xr, Xg, and Xb are partitioned by the edge cover film 23, which is a bank, and for each light-emitting element X, the first electrode 22 in the form of an island, the hole injection layer 24a in the form of an island, the hole transport layer 24b in the form of an island, and the light-emitting layers 24cr, 24cg and 24cb in the form of islands (generically referred to as a light-emitting layer 24c) are provided. Moreover, in the light-emitting element X, the electron transport layer 24d in a flat manner, the electron injection layer 24e in a flat manner, and the second electrode 25 in a flat manner that are common to all the subpixels SP are provided.

To form an organic light-emitting layer (light-emitting layer 24c) of an OLED through evaporation, a fine metal mask (FMM) is used. An FMM is a sheet (made of Invar for instance) having many openings, through one of which an organic substance passes, thus forming an island-shaped organic layer (corresponding to a single subpixel SP). It is noted that other than this description, the organic light-emitting layer (light-emitting layer 24c) of the OLED can be formed through a drop method using a predetermined solution.

When the light-emitting elements Xr, Xg and Xb are OLEDs, a drive current between the first electrode 22 and the second electrode 25 rejoins holes and electrons within the light-emitting layer, thus generating excitons, and these excitons emit light in the process of transition to a ground state. The second electrode 25 has high light transparency, and the first electrode 22 reflects light; thus, light emitted from the functional layer 24 travels upward and exits from the top.

A quantum-dot light-emitting layer (light-emitting layer 24c) of a QLED can be formed in the form of an island (corresponding to a single subpixel SP) by, for instance, applying a solution with quantum dots dispersed within a solvent, followed by patterning using an ink-jet method or photolithography.

Moreover, when the light-emitting elements Xr, Xg, and Xb are QLEDs, a drive current between the first electrode 22 and the second electrode 25 rejoins holes and electrons within the light-emitting layer, thus generating excitons, and these excitons emit light (fluorescent light) in the process of transition from a conduction band level of the quantum dots to a valence band level of the quantum dots.

For the light-emitting layer 5, a light-emitting element including a light-emitting element other than such an OLED or QLED as described above, for instance, an inorganic light-emitting diode, may be used.

Moreover, the following describes, by way of example, an instance where the light-emitting layer 24c is formed of a quantum-dot light-emitting layer containing quantum dots. That is, in the display device 2 according to this embodiment, the red light-emitting element Xr includes a red quantum-dot light-emitting layer that emits red light, the green light-emitting element Xg includes a green quantum-dot light-emitting layer that emits green light, and the blue light-emitting element Xb includes a blue quantum-dot light-emitting layer that emits blue light.

The quantum-dot light-emitting layer (light-emitting layer 24c) contains quantum dots as a functional material that contributes to the function of the light-emitting layer 24c, and an additive added to the light-emitting layer 24c in a predetermined range of additive amount and having a smaller size than the quantum dots (functional material), the details of which will be described later on. Furthermore, the additive added to this quantum-dot light-emitting layer has, as detailed later on, a size that decreases in the order of the red quantum-dot light-emitting layer, the green quantum-dot light-emitting layer and the blue quantum-dot light-emitting layer, in accordance with the size of a corresponding quantum dot. Moreover, each of the other layers of the functional layer 24, that is, the hole injection layer 24a, the hole transport layer 24b, the electron transport layer 24d and the electron injection layer 24e similarly contains a corresponding functional material, and an additive added to the layer in a predetermined range of additive amount and having a smaller size than the functional material. Specific functional materials, that is, a hole injection material, a hole transport material, a quantum dot, an electron transport material, and electron injection material as well as the additive will be described later on.

The first electrode 22 is composed of, for instance, a stack of indium tin oxide (ITO) and silver (Ag) or a stack of ITO and Ag-containing alloy and has light reflectivity. The second electrode 25 (cathode) is composed to contain metal nanowires (e.g., silver nanowires), as described later on, and has high light transparency.

The sealing layer 6 is transparent to light and includes an inorganic sealing film 26 directly formed on the second electrode 25 (in contact with the second electrode 25), an organic film 27 over the inorganic sealing film 26, and an inorganic sealing film 28 over the organic film 27. The sealing layer 6, covering the light-emitting layer 5, prevents foreign substances, such as water and oxygen, from intruding into the light-emitting layer 5. It is noted that the placement of the sealing layer 6 can be omitted when the light-emitting layer 24c is composed of a quantum-dot light-emitting layer.

The organic film 27 has a flattening effect and light transparency and can be formed through, for instance, ink jet application using an organic material that can be applied. The inorganic sealing films 26 and 28 are inorganic insulating films and can be composed of, for instance, a silicon oxide film, a silicon nitride film, or a silicon oxide nitride film all of which are formed through CVD, or the films can be composed of, for instance, a laminate of these films.

The function film 39 has at least one of the function of optical compensation, the function of touch sensing, the function of protection, and other functions.

The second electrode 25 in this embodiment contains metal nanowires, which are herein silver nanowires NW in the form of a mesh, as illustrated in FIGS. 5(a) and 5(b). Thus, FIG. 6 shows that the second electrode 25, when composed with the silver nanowires NW having a diameter of 25 nm and with a maximum of five stacked layers for instance, has transmittancy of light (CA) higher in a wavelength region of 380 (nm) to 780 (nm) than the transmittancy of light (Ca) of a silver thin-film electrode (20 nm thick), which is a comparative target, and has over 80% transmittancy of light in a wavelength region of 400 (nm) to 780 (nm). FIG. 6 also shows that the reflectivity of light (RB) of the foregoing second electrode 25 is lower in the wavelength region of 380 (nm) to 780 (nm) than the reflectivity of light (Rb) of the comparative target, i.e., the silver thin-film electrode, and that the reflectivity of light (RB) of this second electrode 25 is less than 15% in the wavelength region of 400 (nm) to 780 (nm). It is noted that FIG. 5(b) omits the electron injection layer 24e.

As described above, the display device 2 according to this embodiment, which has an upper electrode, i.e., the second electrode 25 containing the silver nanowires NW in the form of a mesh, can improve the efficiency of light extraction in the top-emission display device 2 and can offer a good visual property.

It is noted that the number of stacked layers of the silver nanowires NW in the second electrode 25 is two to eight and is preferably three to six. The silver nanowires NW have a diameter ($\Phi$) of 5 to 100 (nm), preferably has a diameter ($\Phi$) of 10 to 80 (nm) and more desirably has a diameter ($\Phi$) of 20 to 50 (nm). The silver nanowire NW has a length (trace length) of 1 to 100 ($\mu$m), preferably has a length of 5 to 50 ($\mu$m) and more desirably has a length of 8 to 30 ($\mu$m). It is noted that these values can be obtained through observations using a scanning electron microscope. The silver nanowire NW has an electrical resistance (surface resistance) of 5 to 200 ($\Omega$/Sq), preferably has an electrical resistance of 10 to 100 ($\Omega$/Sq) and more desirably has an electrical resistance of 10 to 50 ($\Omega$/Sq).

Moreover, the silver nanowire NW has a length (average trace length) smaller than the distance (inter-terminal gap), Pc, between the adjacent terminals TM1 and TM2 in the terminal section TA, as illustrated in FIG. 5(c). This can avoid a short circuit between the terminals TM1 and TM2 resulting from the silver nanowires NW (metal nanowires) that intrude into the terminal section TA when the second electrode 25 is formed.

Moreover, although Ag is used in this embodiment as the material of the metal nanowires within the second electrode 25, the material is not limited to Ag. Nanowires made of any one of Au, Al and Cu may be used, or nanowires made of two or more of Ag, Au, Al and Cu may be used.

Figure 7:
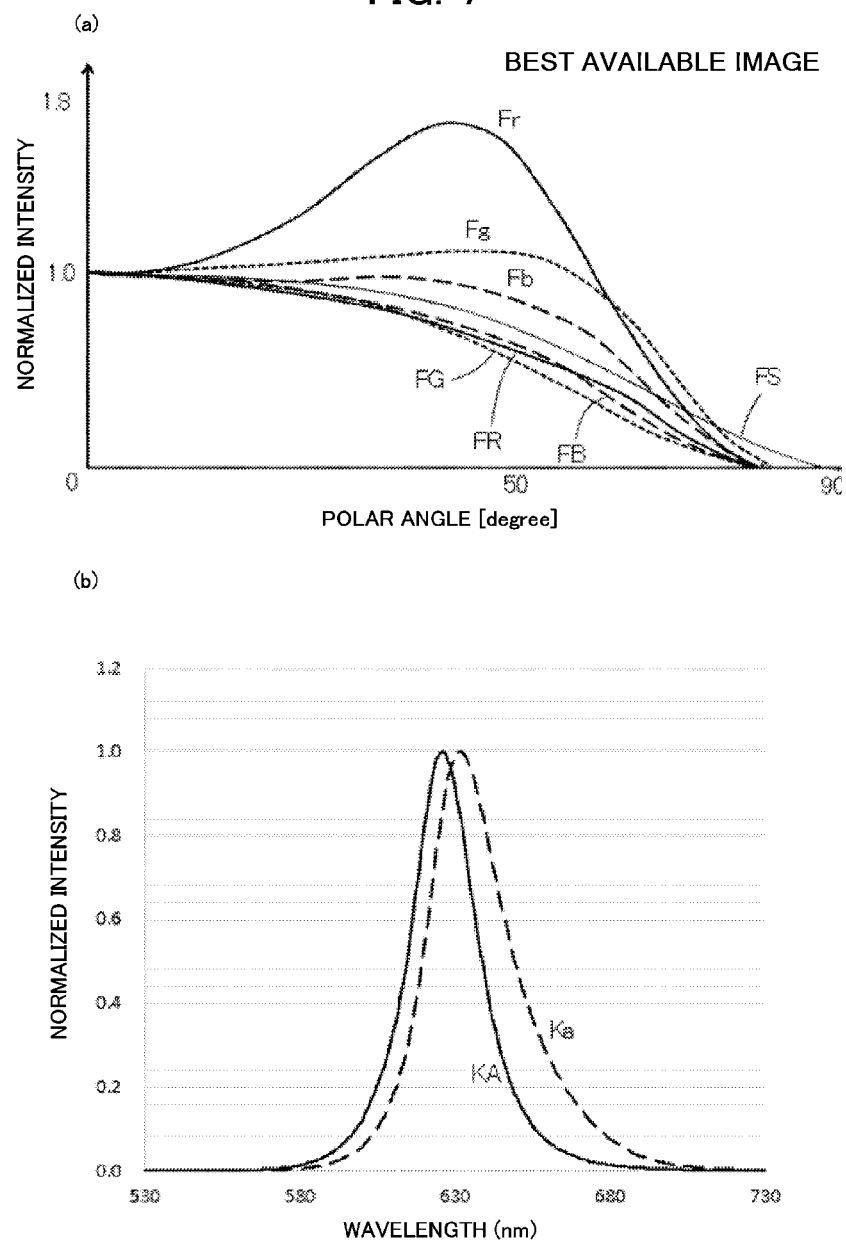
FIG. 7(a) and FIG. 7(b) are graphs showing an effect of the second electrode shown in FIG. 2, with the light-emitting layer in FIG. 2 having a quantum-dot light-emitting layer.

With now reference to FIG. 7, the following specifically describes an optical effect in an instance where a quantum-dot light-emitting layer is used for the light-emitting layer 5 and where the foregoing metal nanowire is used for the second electrode 25. FIGS. 7(a) and 7(b) are graphs showing an effect of the second electrode shown in FIG. 2, with the light-emitting layer in FIG. 2 having a quantum-dot light-emitting layer.

FIG. 7(a) shows that with regard to the characteristics of a polar angle and a normalized intensity of light, the characteristic in the device according to this embodiment, where a quantum-dot light-emitting layer and the second electrode (silver nanowire NW) 25 are used in combination, i.e., a characteristic FR of red, a characteristic FG of green, and a characteristic FB of blue, is closer to a Lambertian light-distribution characteristic FS in all the three colors than the characteristic of a device in a comparative example, where a quantum-dot light-emitting layer and a silver thin-film electrode are used in combination, i.e., a characteristic Fr of red, a characteristic Fg of green, and a characteristic Fb of blue. It is noted that in the device according to this embodiment and the device according to the comparative example, the thicknesses of carrier injection layers, carrier transport layers and a light-emitting layer are rendered common between the colors. Here, a Lambertian light-distribution characteristic is an ideal light-distribution characteristic, where radiant intensity in the direction of an angle θ is indicated by cos θ times of the radiant intensity on an optical axis, with the vertical front set at 0 degrees. In addition, carriers include each of electrons and holes.

FIG. 7(b) shows that in a red-light emission property Ka in a comparative example, where a quantum-dot light-emitting layer (designed to emit red light having, for instance, a PL peak wavelength of 620 nm and a half-value breadth of 25 nm) and a silver thin-film electrode having large reflectivity of light are used in combination, an inter-electrode cavity effect (resonance effect) adversely affects the peak wavelength, which herein shifts toward a long wavelength to thus exceed 630 nm, and adversely affects the half-value breadth, which herein increases to 32 nm, whereas the device according to this embodiment, where the foregoing quantum-dot light-emitting layer (designed to emit red light) and the second electrode (silver nanowires NW) 25 are used in combination, exhibits a red-light emission property KA with little change, where the peak wavelength is herein in a reasonable position (about 620 nm) and where the half-value breadth is herein 25 nm.

As such, using a high-transmittancy metal nanowire (e.g., the silver nanowires NW) for the second electrode 25 little exhibits a cavity effect. As a result, using such a metal nanowire for a QLED, which is adversely affected by a cavity effect, can achieve a greater effect (i.e., an improvement in visual angle property). Moreover, since a cavity effect appears little, as shown in FIG. 7(a), the thicknesses of the individual layers between the first electrode 22 and the second electrode 25 can be brought close to a Lambertian light distribution without having to be adjusted to an optimal value among the light emitting elements Xr, Xg and Xb, and the thicknesses of the individual layers can be common (same). Consequently, this embodiment can facilitate manufacturing the display device 2 that has a high visual-angle property.

Figure 8:
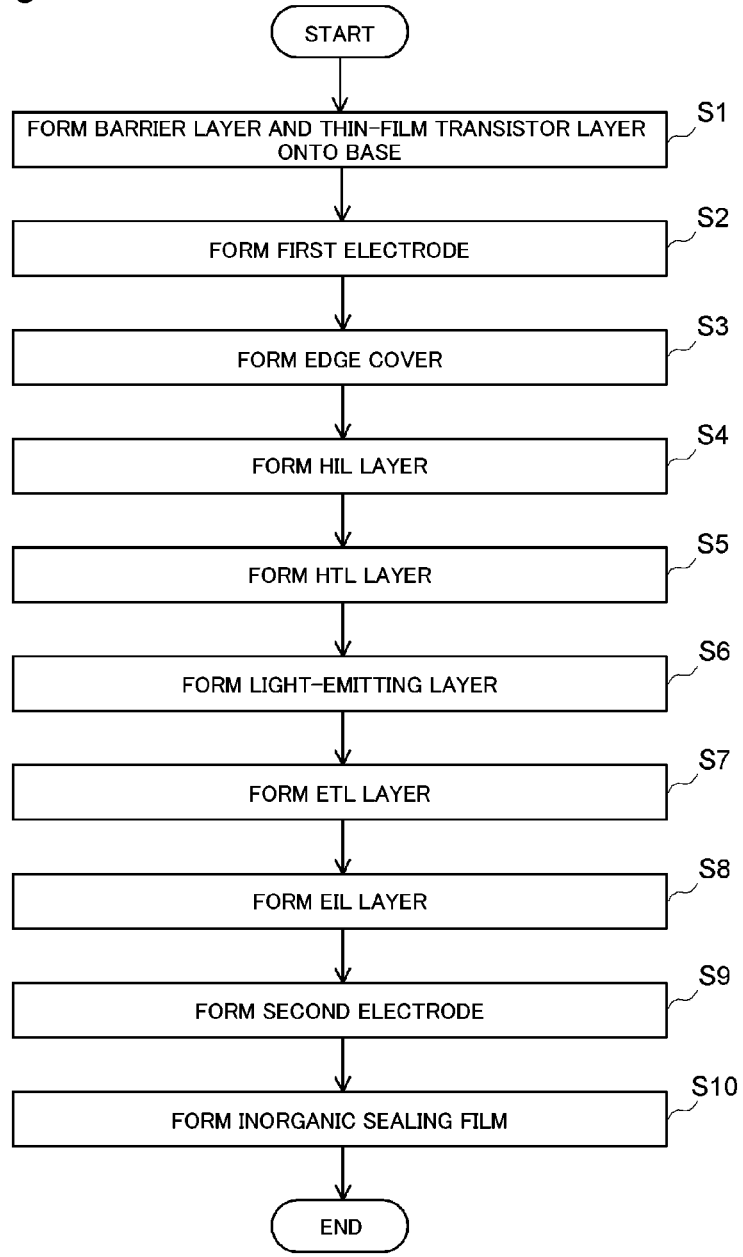
FIG. 8 is a flowchart showing a method for manufacturing the display device.
Figure 9:
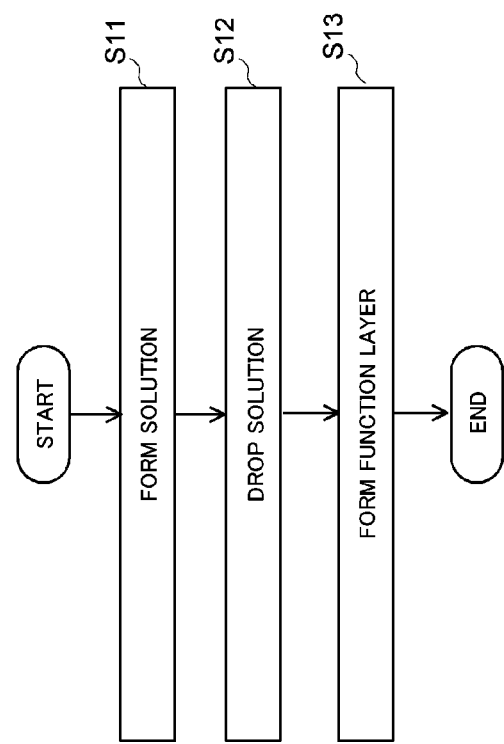
FIG. 9 is a flowchart showing a method for manufacturing the main components of the display device.

The following specifically describes a method for manufacturing the display device 2 according to this embodiment with reference also to FIG. 8 and FIG. 9. FIG. 8 is a flowchart showing the method for manufacturing the display device. FIG. 9 is a flowchart showing a method for manufacturing the main components of the display device.

As shown in FIG. 8, the method for manufacturing the display device 2 according to this embodiment includes, firstly, forming the barrier layer 3 and the thin-film transistor layer 4 onto the base 12 (Step S1). The next is forming the first electrode 22 onto the flattening film 21 through sputtering and photolithography (Step S2). The next is forming the edge cover film 23 (Step S3). The next is forming the hole injection layer (HIL) 24a through a drop method, such as an ink-jet method (Step S4). The next is forming the hole transport layer (HTL) 24b through a drop method, such as an ink-jet method (Step S5). The next is forming the light-emitting layer 24c consisting of a quantum-dot light-emitting layer through a drop method, such as an ink-jet method (Step S6).

The next is forming the electron transport layer (ETL) 24d consisting of, for instance, a zinc-oxide nanoparticle layer through a drop method, such as an ink-jet method or spin coating (Step S7). The next is forming the electron injection layer 24e through a drop method, such as an ink-jet method or spin coating (Step S8). The next is forming the second electrode 25 onto the electron injection layer 24e by applying a silver-nanowire solution with silver nanowires NW dispersed in a predetermined solvent (Step S9). It is noted that the silver-nanowire solution may contain a binder, a dispersant, or other additives. The next is drying the silver-nanowire solution applied (solvent removal). The next is forming the inorganic sealing film 26 so as to cover the second electrode 25, followed by applying a material (precursor) of the organic film 27 onto the inorganic sealing film 26 through ink-jet application, followed by curing to form the organic film 27, followed by forming the inorganic sealing film 28 over the organic film 27 (Step S10).

Moreover, in the method for manufacturing the display device 2 according to this embodiment, the individual layers of the functional layer 24, that is, the hole injection layer 24a, the hole transport layer 24b, the light-emitting layer 24c, the electron transport layer 24d, and the electron injection layer 24e, are each formed through a drop method using a predetermined solution.

To be specific, as shown in FIG. 9, the formation of the individual layers of the functional layer 24 includes, firstly, a solution formation step of putting a functional material that contributes to the function of the functional layer 24 into a predetermined solvent, and adding an additive having a smaller size than the functional material into the predetermined solvent in a predetermined range of additive amount, to form a solution for forming the functional layer 24 (Step S11).

The next is a solution-drop step of dropping the solution formed in the solution formation step over the first electrode 22 (Step S12). The next is a function-layer formation step of drying the solvent within the solution dropped in the solution-drop step to form a functional layer (Step S13).

That is, in the solution-drop step and the function-layer formation step, a solution for forming a hole injection layer is dropped onto the first electrode 22 through, for instance, an ink-jet method, and the hole injection layer 24a is formed by vaporizing the solvent within the solution for forming a hole injection layer.

Here, for the solution for forming a hole injection layer, 2-propanol, butyl benzoate, toluene, chlorobenzene, tetrahydrofuran, and 1,4-dioxane for instance are used as the solvent. Moreover, inorganic compounds such as nickel oxide and tungsten oxide are used as a solute, that is, as a hole injection material (functional material). Moreover, an organic salt selected from the group consisting of, for instance, a quaternary ammonium salt, a lithium tetrafluoroborate salt, and a lithium hexafluorophosphate salt is used for the additive. Furthermore, for the use of a quaternary ammonium salt as the additive, a cation selected from the group consisting of a tetramethylammonium cation, a tetraethylammonium cation, and a tetrabutylammonium cation, and an anion selected from the group consisting of a chloride anion, a bromine anion, an iodine anion, a tetrafluoroborate anion, a tetrafluorophosphate anion, a hexafluorophosphate anion, and a trifluoromethanesulfonylimide anion are used.

It is noted that when the light-emitting elements Xr, Xg, and Xb are OLEDs, the foregoing inorganic compound such as nickel oxide or tungsten oxide as well as, for instance, benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, and azatriphenylene and derivatives thereof, as well as organic chained conjugated polymers, including a polysilane compound, a vinylcarbazole compound, a thiophene compound, and an aniline compound, can be used as a hole injection material (functional material) of the solution for forming a hole injection layer. Moreover, the same solvent and additive as those in the foregoing QLED can be used for the solution for forming a hole injection layer in this OLED.

Next, a solution for forming a hole transport layer is dropped onto the hole injection layer 24a through, for instance, an ink-jet method, and the hole transport layer 24b is formed by vaporizing the solvent within the solution for forming a hole transport layer.

Here, for the solution for forming a hole transport layer, chlorobenzene, toluene, tetrahydrofuran, and 1,4-dioxane for instance are used as the solvent. Moreover, organic polymeric compounds, including TFB, PVK, and poly-TPD, are used as a solute, that is, a hole transport material (functional material). Moreover, an organic salt selected from the group consisting of, for instance, a quaternary ammonium salt, a lithium tetrafluoroborate salt, and a lithium hexafluorophosphate salt is used for an additive, like the foregoing solution for forming a hole injection layer.

It is noted that when the light-emitting elements Xr, Xg, and Xb are OLEDs, the foregoing organic polymeric compounds, including TFB, PVK, and poly-TPD, as well as, for instance, benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, and azatriphenylene and derivatives thereof, as well as organic chained conjugated polymers, including a polysilane compound, a vinylcarbazole compound, a thiophene compound, and an aniline compound, can be used as a hole transport material (functional material) of the solution for forming a hole transport layer. Moreover, the same solvent and additive as those in the foregoing QLED can be used for the solution for forming a hole transport layer in this OLED.

Next, a solution for forming a light-emitting layer is dropped onto the hole transport layer 24b through, for instance, an ink-jet method, and the light-emitting layer 24c is formed by vaporizing the solvent within the solution for forming a light-emitting layer.

Here, for the solution for forming a light-emitting layer, toluene, octane, chlorobenzene, tetrahydrofuran, and 1,4-dioxane for instance are used as the solvent. Moreover, a quantum dot or an organic compound containing, for instance, C, Si, Ge, Sn, P, Se, Te, Cd, Zn, Mg, S, In, or O is used as a solute, that is, a light-emitting layer material (functional material). Moreover, an organic salt selected from the group consisting of, for instance, a quaternary ammonium salt, a lithium tetrafluoroborate salt, and a lithium hexafluorophosphate salt is used for an additive, like the foregoing solution for forming a hole injection layer.

It is noted that when the light-emitting elements Xr, Xg, and Xb are OLEDs, the foregoing quantum dot or organic compound containing C, Si, Ge, Sn, P, Se, Te, Cd, Zn, Mg, S, In, or O, as well as, for instance, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, as well as organic light-emitting materials, including a tri(dibenzoylmethyl)phenanthrolineeuropium complex and ditolylvinylbiphenyl can be used as a light-emitting layer material (functional material) of the solution for forming a light-emitting layer. Moreover, the same solvent and additive as those in the foregoing QLED can be used for the solution for forming a light-emitting layer in this OLED.

Next, a solution for forming an electron transport layer is dropped onto the light-emitting layer 24c through, for instance, an ink-jet method or spin coating, and the electron transport layer 24d is formed by vaporizing the solvent within the solution for forming an electron transport layer.

Here, for the solution for forming an electron transport layer, 2-propanol, ethanol, toluene, chlorobenzene, tetrahydrofuran, and 1,4-dioxane for instance are used as the solvent. Moreover, a nanoparticle of zinc oxide (ZnO) or magnesium-added zinc oxide (MgZnO) for instance is used as a solute, that is, an electron transport material (functional material). Moreover, an organic salt selected from the group consisting of, for instance, a quaternary ammonium salt, a lithium tetrafluoroborate salt, and a lithium hexafluorophosphate salt is used for an additive, like the foregoing solution for forming a hole injection layer.

It is noted that when the light-emitting elements Xr, Xg, and Xb are OLEDs, the foregoing nanoparticle of zinc oxide (ZnO) or magnesium-added zinc oxide (MgZnO), as well as, for instance, quinoline, perylene, phenanthroline, bistyryl, pyrazine, triazole, oxazole, oxadiazole, fluorenone and the derivatives and metal complexes thereof, to be more specific, for instance, 3,3'-bis(9H-carbazole-9-yl)biphenyl (mCBP), 1,3,5-tris(N-phenylbenzimidazole-2-yl)benzene (TPBI), 3-phenyl-4(1'-naphthyl)-5-phenyl-1,2,4-triazole (TAZ), 1,10-phenanthroline, and tris(8-hydroxyquinoline) aluminum (Alq) can be used as an electron transport material (functional material) of the solution for forming an electron transport layer. Moreover, the same solvent and additive as those in the foregoing QLED can be used for the solution for forming an electron transport layer in this OLED.

Finally, a solution for forming an electron injection layer is dropped onto the electron transport layer 24d through, for instance, an ink-jet method or spin coating, and the electron injection layer 24e is formed by vaporizing the solvent within the solution for forming an electron injection layer. Accordingly, each layer of the functional layer 24 illustrated in FIG. 4 is formed through a drop method.

Here, for the solution for forming an electron injection layer, 2-propanol, ethanol, toluene, chlorobenzene, tetrahydrofuran, and 1,4-dioxane for instance are used as a solvent. Moreover, a nanoparticle of zinc oxide (ZnO) or magnesium-added zinc oxide (MgZnO) for instance is used as a solute, that is, an electron injection material (functional material). Moreover, an organic salt selected from the group consisting of, for instance, a quaternary ammonium salt, a lithium tetrafluoroborate salt, and a lithium hexafluorophosphate salt is used for an additive, like the foregoing solution for forming a hole injection layer.

It is noted that when the light-emitting elements Xr, Xg, and Xb are OLEDs, the foregoing nanoparticle of zinc oxide (ZnO) or magnesium-added zinc oxide (MgZnO), as well as, for instance, quinoline, perylene, phenanthroline, bistyryl, pyrazine, triazole, oxazole, oxadiazole, fluorenone and the derivatives and metal complexes thereof, to be more specific, for instance, 3,3'-bis(9H-carbazole-9-yl)biphenyl (mCBP), 1,3,5-tris(N-phenylbenzimidazole-2-yl)benzene (TPBI), 3-phenyl-4(1'-naphthyl)-5-phenyl-1,2,4-triazole (TAZ), 1,10-phenanthroline, and tris(8-hydroxyquinoline) aluminum (Alq) can be used as an electron injection material (functional material) of the solution for forming an electron injection layer. Moreover, the same solvent and additive as those in the foregoing QLED can be used for the solution for forming an electron injection layer in this OLED.

Moreover, an additive having a smaller size than the functional material of each layer is used; the additive is designed to extend to the periphery of the corresponding functional layer at the time of solution dropping, thus avoiding the functional material from segregation caused by a coffee ring effect (the details will be described later on). To be specific, an additive having a diameter of 0.4 to 0.8 nm is used and is configured to exert the foregoing avoidance effect with certainty. It is noted that using an additive of less than 0.4 nm in diameter possibly fails to avoid the functional material from concentrating on the foregoing periphery, thus reducing the avoidance effect in some cases. It is also noted that using an additive of over 0.8 nm in diameter possibly causes the additive to hinder the function of the functional material of the functional layer, thus degrading the performance of the functional layer in some cases.

Moreover, for the solution for forming a light-emitting layer, additives having mutually different sizes are used for the red quantum-dot light-emitting layer (light-emitting layer 24cr), the green quantum-dot light-emitting layer (light-emitting layer 24cg), and the blue quantum-dot light-emitting layer (light-emitting layer 24cb). To be specific, when CdSe is used as a quantum dot, an additive having a diameter of 8 to 11 nm, an additive having a diameter of 5 to 8 nm, and an additive having a diameter of 2 to 3 nm are respectively used for the light-emitting layers 24cr, 24cg, and 24cb; the additives have a size that decreases in the order of the red quantum-dot light-emitting layer (light-emitting layer 24cr), the green quantum-dot light-emitting layer (light-emitting layer 24cg), and the blue quantum-dot light-emitting layer (light-emitting layer 24cb) in accordance with the size of a corresponding quantum dot.

Furthermore, the additive in the solution for forming each layer of the functional layer 24 is added to the functional layer 24 in a predetermined range of additive amount: an additive amount of 1 to 3 mg/ml. It is noted that an additive amount of less than 1 mg/ml possibly reduces the foregoing avoidance effect of the additive. It is also noted that an additive amount of over 3 mg/ml possibly degrades the dispersibility of the functional material, thus failing to form the functional layer 24 in some cases.

The concentration of the functional material within the solution in each layer of the functional layer 24 is preferably 10 w % or smaller, more desirably 6 w % or smaller, and further preferably 4 w % or smaller. This enables the dropped solution to be dried quickly, thus improving the rate of forming each layer (film formation rate), thus improving the rate of manufacturing the display device 2 as well.

The display device 2 can be manufactured as described above.

In the display device 2 according to this embodiment configured as described above, the functional layer 24 contains a functional material, and an additive added to the functional layer 24 in a predetermined range of additive amount and having a smaller size than the functional material. This enables the display device 2 according to this embodiment to avoid the functional material from segregation caused in the periphery of the functional layer 24 by a coffee ring effect further than in the middle of the functional layer 24 even when the functional layer 24 is formed using a drop method. As a result, the display device 2 according to this embodiment can avoid reduction in display performance, unlike the foregoing known device.

Here, the following specifically describes an effect of the display device 2 according to this embodiment with reference to FIG. 10 and FIG. 11. FIG. 10 illustrates a problem in a comparative example; FIG. 10(a) illustrates how a functional layer is formed in the comparative example, and FIG. 10(b) illustrates how a subpixel emits light in the comparative example. FIG. 11 illustrates an effect in the device according to this embodiment; FIG. 11(a) illustrates how the functional layer is formed in the device according to this embodiment, and FIG. 11(b) illustrates how a subpixel emits light in the device according to this embodiment.

Firstly, in the comparative example, where the additive in this embodiment is not added to a solution for forming a functional layer, a functional material FP within the solution for forming a functional layer dropped onto a lower layer UL is segregated in the periphery further than in the middle due to a coffee ring effect, as illustrated in FIG. 10(a). In particular, in the process of vaporization of the solvent within the solution for forming a functional layer, the solvent vaporized from the edge of the solution for forming a functional layer is filled up from the inside of the solution for forming a functional layer; accordingly, the solute, that is, the functional material FP is also transported simultaneously from the center toward the periphery, thus causing a coffee ring effect to appear conspicuously. As a result, in the comparative example, the middle of the subpixel SP can constitute, in a plan view, a non-emission region L1 that does not contribute to light emission, and only the periphery of the subpixel SP can constitute, in a plan view, an emission region L2 that contributes to light emission, as illustrated in FIG. 10(b).

In the device according to this embodiment by contrast, an additive TP within the solution for forming a functional layer dropped onto the lower layer UL further extends to the periphery than the functional material FP within the solution for forming a functional layer, thus successfully avoiding the functional material FP from being segregated in the periphery by a coffee ring effect, as illustrated in FIG. 11(a). As a result, in the device according to this embodiment, the entire surface of the subpixel SP constitutes, in a plan view, an emission region L0 that contributes to light emission, as illustrated in FIG. 11(b).

First Modification

Figure 12:
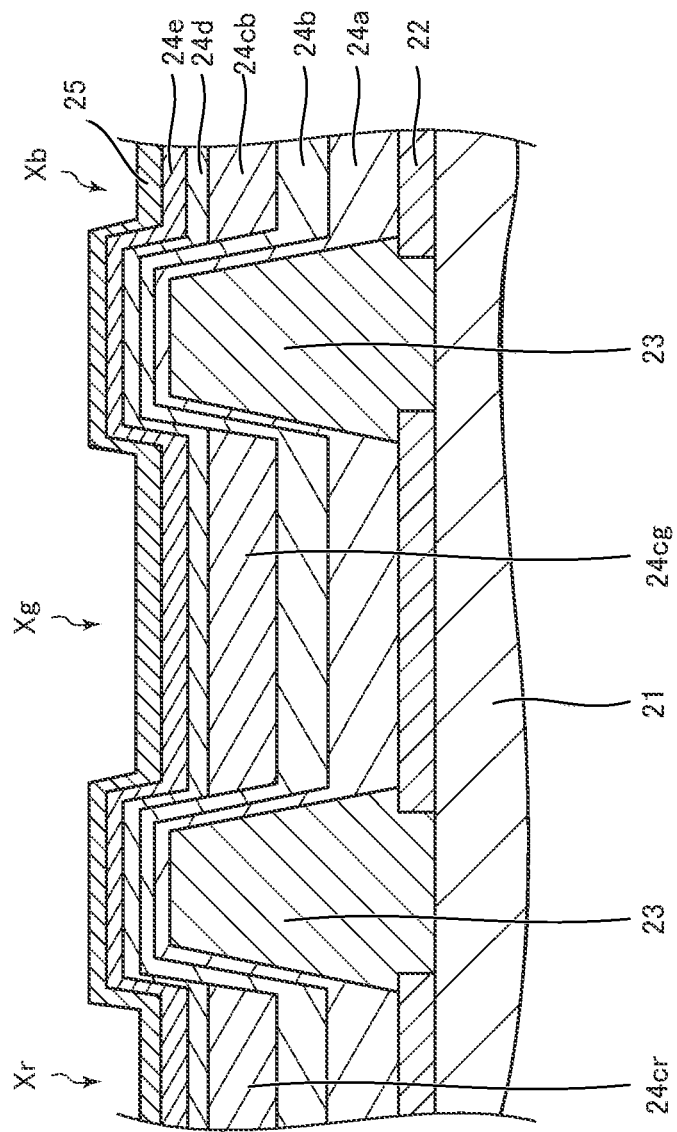
FIG. 12 is a sectional view of a first modification of the display device.

FIG. 12 is a sectional view of a first modification of the display device.

In the drawing, a main difference between the first modification and the first embodiment lies in that the hole injection layer 24a and the hole transport layer 24b are provided as common layers common to all the subpixels. It is noted that components common to those in the first embodiment will be denoted by the same signs, and that the description of redundancies between them will be omitted.

In the display device 2 according to the first modification, the hole injection layer 24a and the hole transport layer 24b are formed in a flat manner to be common to the light-emitting elements Xr, Xg and Xb, as illustrated in FIG. 12. That is, the hole injection layer 24a and the hole transport layer 24b each can be formed not only through such an ink-jet method as described in the first embodiment, but through other drop methods, including spin coating.

The first modification with the foregoing configuration can achieve an action and effect similar to that in the first embodiment. Moreover, the hole injection layer 24a and the hole transport layer 24b are formed as common layers, thus also enabling simplified process steps for manufacturing the display device 2.

Second Modification

FIG. 13 illustrates main components in a second modification of the display device; FIG. 13(a) is a perspective view of a specific configuration of the second electrode in the second modification, and FIG. 13(b) illustrates a specific configuration of the light-emitting layer in the second modification. FIG. 13(c) is a graph showing an effect in the second modification.

In the drawings, a main difference between the second modification and the first embodiment lies in that the second electrode 25 including an electron injection layer and an electron transport layer is provided. It is noted that components common to those in the first embodiment will be denoted by the same signs, and that the description of redundancies between them will be omitted.

In the display device 2 according to the second modification, the second electrode 25 contains silver nanowires NW, and zinc oxide (ZnO) nanoparticles NP, which are an electron injection layer material and electron transport material, as illustrated in FIG. 13(a). That is, the second electrode 25 containing the silver nanowires NW and the zinc oxide nanoparticles NP is obtained by applying and drying a mixed solution with a silver-nanowire solution and a zinc-oxide nanoparticle solution mixed at a desired ratio and stirred. To be specific, a configuration is established where the silver nanowires NW are arranged three-dimensionally on a random basis to allow the silver nanowires NW to pass through the gaps between the zinc oxide nanoparticles NP (an average particle diameter of 1 to 30 nm).

Moreover, in the display device 2 according to the second modification, a configuration is established where the first electrode 22 (anode), the HTL layer (hole transport layer) 24b, the light-emitting layer 24c (e.g., a quantum-dot light-emitting layer), and the second electrode (common cathode) 25 including the electron injection layer and the electron transport layer are provided in this order, as illustrated in FIG. 13(b).

Moreover, in the configuration shown in FIG. 13(a), the area of contact between the silver nanowires NW within the second electrode 25 and the zinc oxide nanoparticles NP within the second electrode 25, which are electron transport materials, increases; accordingly, FIG. 13(c) shows that in the range of a current density of 0 to 50 [milliampere/square centimeter], an external quantum effect UB (standardized value with respect to a reference value) of the light-emitting element X in the second modification improves to a much greater degree than the configuration shown in FIG. 3, i.e., an external quantum effect UA (a reference value at each current density=1) of the light-emitting element X including the second electrode 25 formed on the electron injection layer (zinc-oxide nanoparticle layer) 24e, and to a much greater degree than a standardized external quantum effect Ua (standardized value with respect to a reference value) of a typical light-emitting element having a cathode of a silver thin film.

Moreover, the number of process steps can be reduced when compared to an instance where the electron transport layer 24d, the electron injection layer 24e, and the second electrode (common cathode) 25 are formed in different process steps.

Moreover, too many metal nanowires NW reduce the ability of electron transport to the light-emitting layer 24c, whereas too few metal nanowires NW increase the value of electrical resistance. Accordingly, the volume ratio of the metal nanowires NW to the ZnO nanoparticles NP is 1/49 to 1/9.

The second modification with the foregoing configuration can achieve an action and effect similar to that in the first embodiment.

SECOND EMBODIMENT

Figure 14:
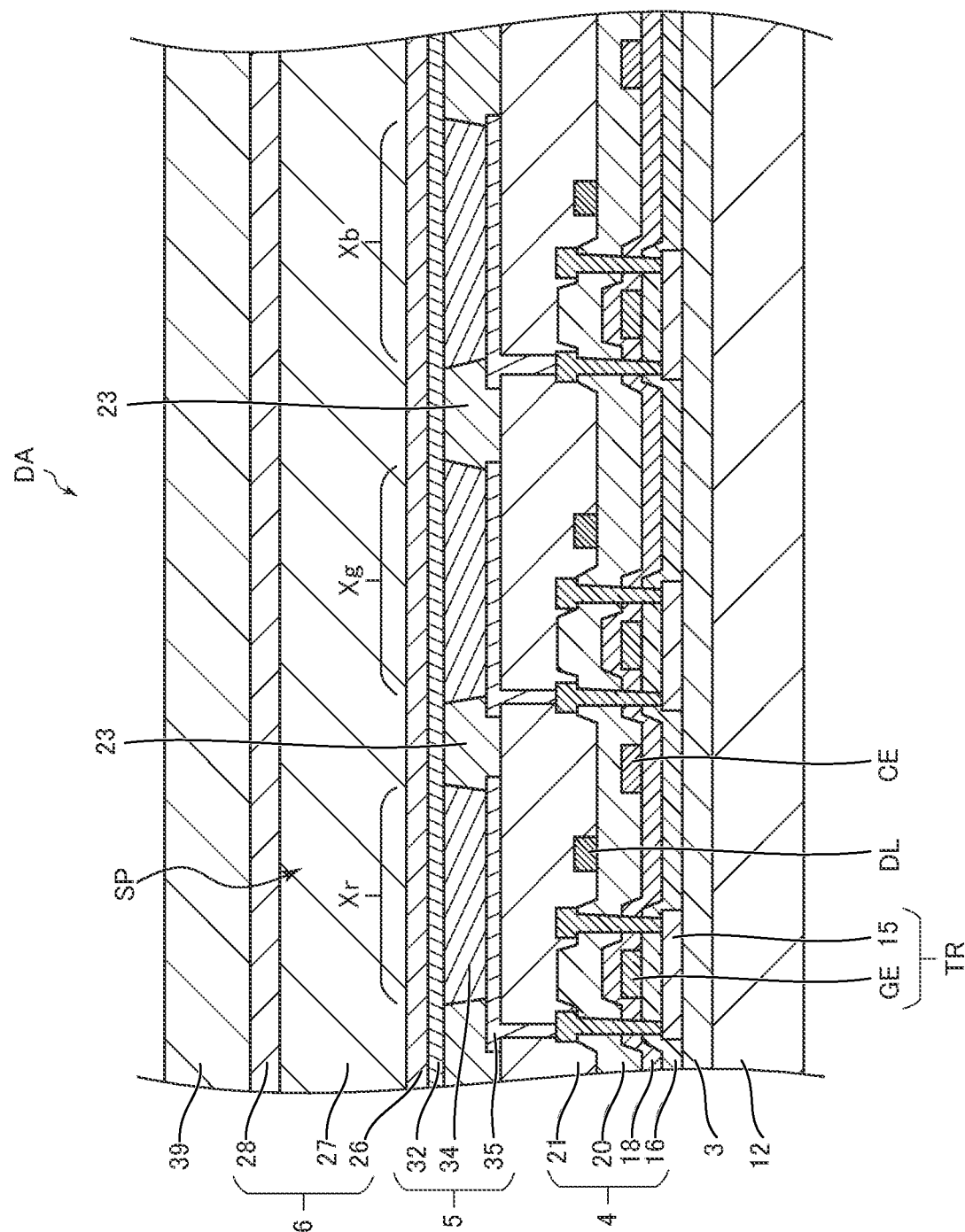
FIG. 14 is a sectional view of main components of a display device according to a second embodiment of the disclosure.
Figure 15:
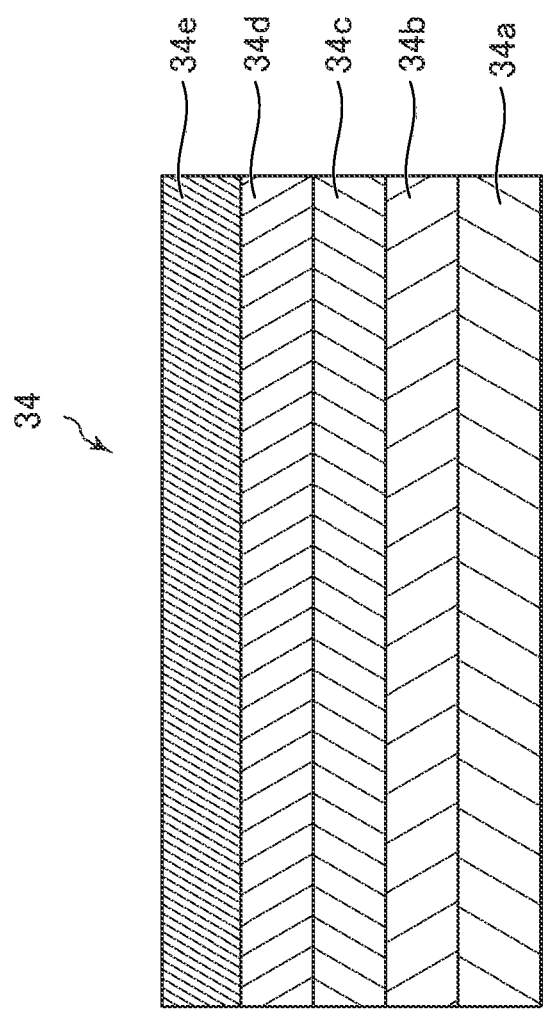
FIG. 15 is a sectional view of a specific configuration of a functional layer shown in FIG. 14.
Figure 16:
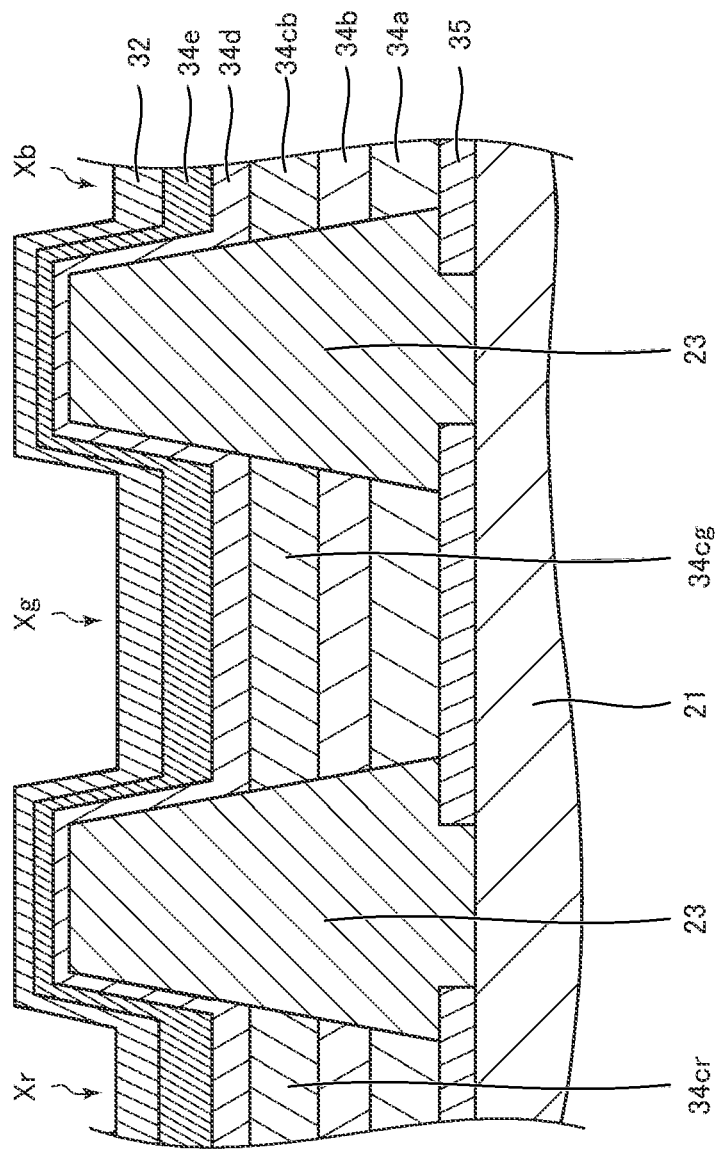
FIG. 16 is a sectional view of a specific example configuration of a light-emitting element shown in FIG. 14.

FIG. 14 is a sectional view of main components of a display device according to a second embodiment of the disclosure. FIG. 15 is a sectional view of a specific configuration of a functional layer shown in FIG. 14. FIG. 16 is a sectional view of a specific example configuration of a light-emitting element shown in FIG. 14.

In the drawings, a main difference between this embodiment and the first embodiment lies in an inverted structure where a first electrode 35, which is a cathode, a functional layer 34, and a second electrode 32, which is an anode, are provided in this order on the thin-film transistor layer 4. It is noted that components common to those in the first embodiment will be denoted by the same signs, and that the description of redundancies between them will be omitted.

In the display device 2 according to this embodiment, the first electrode (cathode) 35, the functional layer 34, and the second electrode (anode) 32 are sequentially provided on the thin-film transistor layer 4 in the light-emitting elements Xr, Xg, and Xb, as illustrated in FIG. 14. Moreover, the functional layer 34 is composed of a stack of, in sequence from the bottom, an electron injection layer 34a, an electron transport layer 34b, a light-emitting layer 34c, a hole transport layer 34d, and a hole injection layer 34e, as illustrated in FIG. 15.

Moreover, in the display device 2 according to this embodiment, the light-emitting elements Xr, Xg, and Xb are partitioned by the edge cover film 23, which is a bank, and for each light-emitting element X, the first electrode 35 in the form of an island, the electron injection layer 34a in the form of an island, the electron transport layer 24b in the form of an island, and light-emitting layers 34cr, 34cg and 34cb in the form of islands (generically referred to as a light-emitting layer 34c) are provided. Moreover, in the light-emitting element X, the hole transport layer 34d in a flat manner, the hole injection layer 34e in a flat manner, and the second electrode 32 in a flat manner that are common to all the subpixels SP are provided.

This embodiment with the foregoing configuration can achieve an action and effect similar to that in the first embodiment.

Modification

Figure 17:
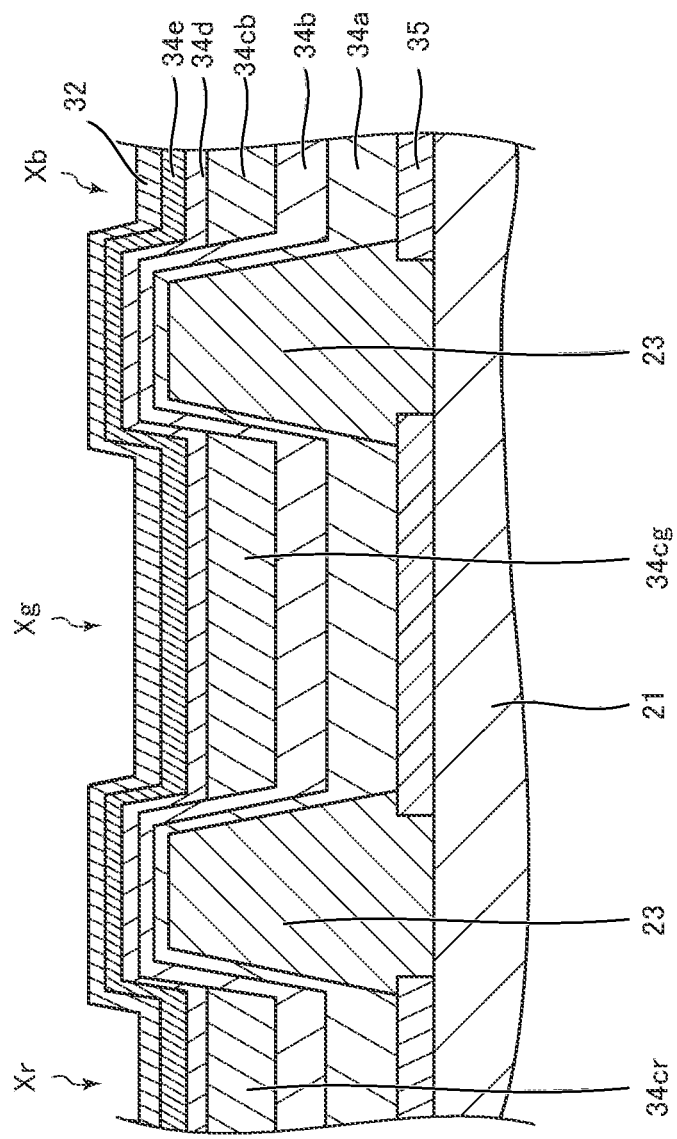
FIG. 17 is a sectional view of a modification of the display device shown in FIG. 14.

FIG. 17 is a sectional view of a modification of the display device shown in FIG. 14.

In the drawing, a main difference between this modification and the second embodiment lies in that the electron injection layer 34a and the electron transport layer 34b are provided as common layers common to all the subpixels. It is noted that components common to those in the second embodiment will be denoted by the same signs, and that the description of redundancies between them will be omitted.

In the display device 2 according to this modification, the electron injection layer 34a and the electron transport layer 34b are formed in a flat manner to be common to the light-emitting elements Xr, Xg and Xb, as illustrated in FIG. 17. That is, the electron injection layer 34a and the electron transport layer 34b each can be formed not only through such an ink-jet method as described in the second embodiment, but through other drop methods, including spin coating.

This modification with the foregoing configuration can achieve an action and effect similar to that in the second embodiment. Moreover, the electron injection layer 34a and the electron transport layer 34b are formed as common layers, thus also enabling simplified process steps for manufacturing the display device 2.

INDUSTRIAL APPLICABILITY

The disclosure is useful for a display device that can prevent degradation in display performance even when a functional layer is formed using a drop method and is useful for a method for manufacturing the display device.

The invention claimed is:

1. A display device provided with a display region having a plurality of pixels, and a frame region surrounding the display region, the display device comprising:
    a thin-film transistor layer;
    a first light-emitting layer including a plurality of light-emitting elements, each including a first electrode, a functional layer, and a second electrode, the plurality of light-emitting elements being configured to emit mutually different colors of light; and
    a bank partitioning each of the plurality of pixels in correspondence with each of the plurality of light-emitting elements,
    wherein the functional layer contains a functional material that contributes to a function of the functional layer, and an additive added to the functional layer in a predetermined range of an additive amount and having a smaller size than the functional material,
    the first electrode is provided in an island form in correspondence with each of the plurality of pixels,
    the functional layer includes a second light-emitting layer,
    the bank forms an edge cover overlapping an end of a surface of the first electrode, having an island shape, to define the pixel,
    the second light-emitting layer is provided in an island form inside the edge cover,
    the second light-emitting layer is a quantum-dot light-emitting layer including quantum dots,
    the quantum-dot light-emitting layer further includes a red quantum-dot light-emitting layer that emits red light, a green quantum-dot light-emitting layer that emits green light, and a blue quantum-dot light-emitting layer that emits blue light,
    the additive added to the quantum-dot light-emitting layer has a size that decreases in an order of the red quantum-dot light-emitting layer, the green quantum-dot light-emitting layer, and the blue quantum-dot light-emitting layer based on a size of a corresponding quantum dot, and
    the additive is an organic salt.

2. The display device according to claim 1, wherein the additive has a diameter of 0.4 to 0.8 nm.

3. The display device according to claim 1, wherein the additive is added to the functional layer in an additive amount of 1 to 3 mg/ml.

4. The display device according to claim 1, wherein the organic salt is selected from the group consisting of a quaternary ammonium salt, a lithium tetrafluoroborate salt, and a lithium hexafluorophosphate salt.

5. The display device according to claim 4, wherein
    the quaternary ammonium salt has
    a cation selected from the group consisting of a tetramethylammonium cation, a tetraethylammonium cation, and a tetrabutylammonium cation, and
    an anion selected from the group consisting of a chloride anion, a bromine anion, an iodine anion, a tetrafluoroborate anion, a tetrafluorophosphate anion, a hexafluorophosphate anion, and a trifluoromethanesulfonylimide anion.

6. The display device according to claim 1, wherein
    the first electrode is an anode, and
    a hole transport layer is provided between the anode and the second light-emitting layer.

7. The display device according to claim 6, wherein a hole injection layer is provided between the anode and the hole transport layer.

8. The display device according to claim 1, wherein
    the second electrode is a cathode, and
    an electron transport layer is provided between the cathode and the second light-emitting layer.

9. The display device according to claim 8, wherein the electron transport layer is provided in common with the plurality of pixels.

10. The display device according to claim 8, wherein an electron injection layer is provided between the cathode and the electron transport layer.

11. The display device according to claim 10, wherein the electron injection layer is provided in common with the plurality of pixels.

12. The display device according to claim 1, wherein
    the first electrode is a cathode, and
    an electron transport layer is provided between the cathode and the second light-emitting layer.

13. The display device according to claim 12, wherein an electron injection layer is provided between the cathode and the electron transport layer.

14. The display device according to claim 1, wherein
    the second electrode is an anode, and
    a hole transport layer is provided between the anode and the second light-emitting layer.

15. The display device according to claim 14, wherein the hole transport layer is provided in common with the plurality of pixels.

16. The display device according to claim 14, wherein a hole injection layer is provided between the anode and the hole transport layer.

17. The display device according to claim 16, wherein the hole injection layer is provided in common with the plurality of pixels.

* * * * *